(12) United States Patent
Tansu et al.

(10) Patent No.: US 7,842,531 B2
(45) Date of Patent: Nov. 30, 2010

(54) GALLIUM NITRIDE-BASED DEVICE AND METHOD

(75) Inventors: Nelson Tansu, Bethlehem, PA (US);
Ronald A. Arif, Champaign, IL (US);
Yik Khoon Ee, Bethlehem, PA (US)

(73) Assignee: Lehigh University, Bethlehem, PA (US)

( * ) Notice: Subject to any disclaimer, the term of this patent is extended or adjusted under 35 U.S.C. 154(b) by 0 days.

(21) Appl. No.: 12/398,448

(22) Filed: Mar. 5, 2009

(65) Prior Publication Data

US 2009/0162963 A1    Jun. 25, 2009

Related U.S. Application Data

(62) Division of application No. 11/555,212, filed on Oct. 31, 2006, now Pat. No. 7,518,139.

(51) Int. Cl.
*H01L 31/00* (2006.01)

(52) U.S. Cl. .............................. 438/47; 257/14; 257/15;
257/E33.008; 257/E33.023; 257/E33.025;
257/E33.026; 257/E33.027; 257/E33.028;
257/E33.03; 257/E33.031; 257/E33.032;
257/E33.033; 257/E33.034; 257/E33.037;
438/46

(58) Field of Classification Search .................. 257/14,
257/15, E33.008, E33.023, E33.025, E33.026,
257/E33.027, E33.028, E33.03, E33.031,
257/E33.032, E33.033, E33.034, E33.037;
438/46, 47
See application file for complete search history.

(56) References Cited

U.S. PATENT DOCUMENTS

| | | | |
|---|---|---|---|
| 4,986,635 A | 1/1991 | Spry | |
| 6,625,187 B1 * | 9/2003 | Ikoma et al. | 372/50.22 |
| 6,958,497 B2 | 10/2005 | Emerson et al. | |
| 7,378,680 B2 * | 5/2008 | Johnson et al. | 257/11 |
| 7,425,732 B2 * | 9/2008 | Ueda et al. | 257/103 |
| 2002/0054617 A1 | 5/2002 | Tsuda et al. | |
| 2004/0061102 A1 | 4/2004 | Tansu et al. | |
| 2004/0081214 A1 | 4/2004 | Mawst et al. | |
| 2005/0170167 A1 | 8/2005 | Kim et al. | |
| 2005/0173694 A1 | 8/2005 | Mawst et al. | |
| 2005/0211993 A1 | 9/2005 | Sano et al. | |
| 2006/0017061 A1 | 1/2006 | Sakamoto et al. | |
| 2007/0248135 A1 | 10/2007 | Mawst et al. | |
| 2008/0099755 A1 | 5/2008 | Tansu et al. | |
| 2008/0144685 A1 | 6/2008 | Tansu et al. | |

FOREIGN PATENT DOCUMENTS

| | | |
|---|---|---|
| WO | 2004030032 A2 | 4/2004 |
| WO | 2008133756 A1 | 11/2008 |
| WO | 2004038872 A2 | 3/2009 |

OTHER PUBLICATIONS

International Search Report issued in International (PCT) Patent Application No. PCT/US2007/088778.

* cited by examiner

*Primary Examiner*—Kenneth A Parker
*Assistant Examiner*—Jay C Kim
(74) *Attorney, Agent, or Firm*—Saul Ewing LLP

(57) ABSTRACT

A gallium nitride-based device has a first GaN layer and a type II quantum well active region over the GaN layer. The type II quantum well active region comprises at least one InGaN layer and at least one GaNAs layer comprising 1.5 to 8% As concentration. The type II quantum well emits in the 400 to 700 nm region with reduced polarization affect.

11 Claims, 6 Drawing Sheets

FIG. 1A
*Type-I InGaN QW*
30 Å InGaN
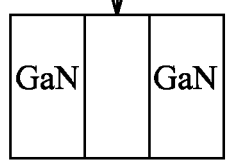
FIG. 1B
*Type-II InGaN-GaNAs QW*
25 Å InGaN → 5 Å InGaN
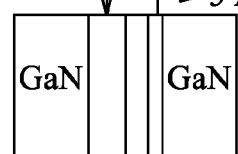
~10 Å $GaN_{1-x}As_x$
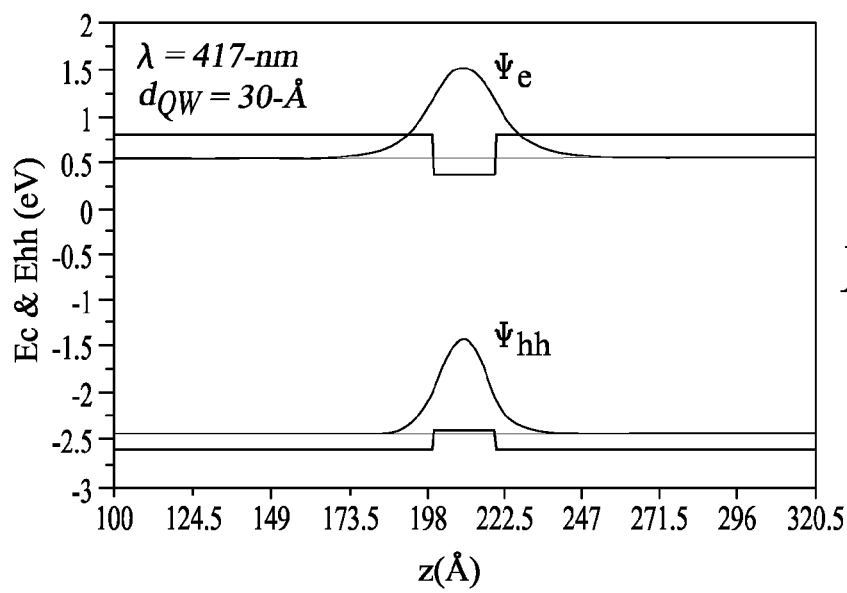
FIG. 2A
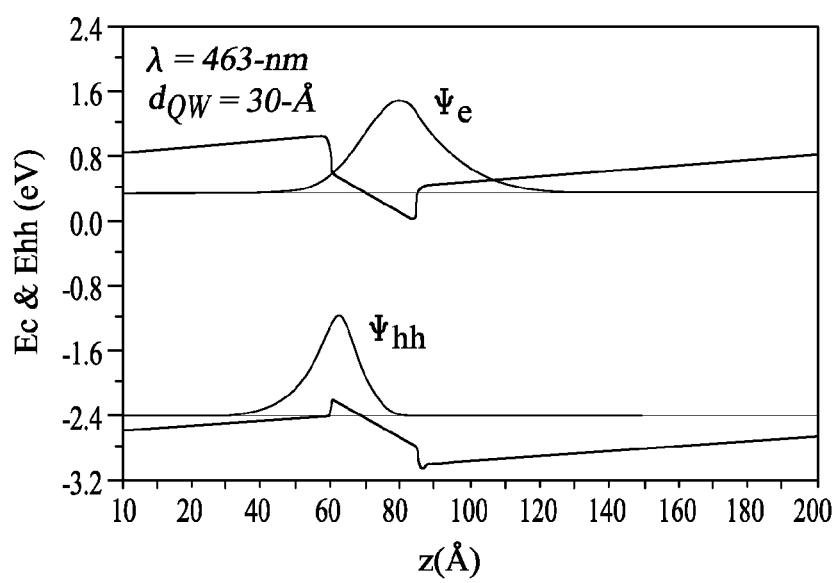
FIG. 2B

GALLIUM NITRIDE-BASED DEVICE AND METHOD

CROSS-REFERENCE TO RELATED APPLICATIONS

This application is a divisional of application Ser. No. 11/555,212, filed on Oct. 31, 2006, the entire contents of which are incorporated herein by reference.

BACKGROUND OF THE INVENTION

The invention relates to a gallium nitride-based device and method. More particularly, the invention relates to an arsenic containing gallium nitride quantum well device and method.

A quantum well (QW) is a potential boundary that confines particles to a planar, substantially two dimension region. Each layer in a multiple quantum well structure has a very small thickness. The electrons and holes in the layer cannot move freely in the direction of thickness and are substantially confined two-dimensionally in a plane perpendicular to the thickness direction. The two dimensional confinement increases bound energy of Coulombic electron and hole attraction so that excitons occur under heat energy at room temperature.

A QW can be formed as part of a semiconductor by having a material, such as gallium arsenide sandwiched between two layers of a wider bandgap material such as aluminium arsenide. A quantum well effect can be achieved in a device with alternating tens to hundreds of two kinds of very thin semiconductor layers with different band gaps. Such structures can be grown by molecular beam epitaxy (MBE) and chemical vapor deposition (MO-CVD). These procedures can provide a layer down to molecular monolayer size.

Because of a quasi two dimensional nature, electrons in a quantum well have a sharper density of state than bulk materials. As a result, quantum well structures are in wide use in diode lasers. They are also used to make HEMTs (High Electron Mobility Transistors), which are used in low-noise electronics.

Quantum well-based emitters (LEDs and diode lasers) in the blue, green, and red regime are important for solid state lightings and medical applications. These applications require highly efficient blue, green, and red diodes integrated in a single semiconductor chip. However only low efficiency can be attained with typical gallium nitride-based quantum wells such as InGaN-based QWs, particularly as emission wavelength is extended beyond green color into red color.

The GaN-based quantum well semiconductor suffers from two main issues. First is high defect or dislocation density, and second is large charge separation in the quantum well. High defect density can be caused by lattice mismatch strain and immature epitaxy of the nitride-material system leading to very high threading dislocation density, thus this results in high nonradiative efficiency. The large separation in quantum well results in low radiative recombination rate and low optical gain.

There is a need for a higher performing gallium nitride-based device capable of efficient emission from 420-nm (blue) up to 650-nm (red), particularly from a blue (~450-nm) to yellow-green (~530-nm) regime.

BRIEF DESCRIPTION OF THE INVENTION

The invention relates to a higher performing gallium nitride-based device capable of emission from a 400 nm to 700 nm region with reduced polarization affect. The invention gallium-nitride based device provides efficient emission from 420-nm (blue) up to 650-nm (red), particularly from a blue (~450-nm) to yellow-green (~530-nm) regime.

According to the invention, a gallium nitride-based device comprises a first GaN layer and a type II quantum well active region over the GaN layer comprising at least one InGaN layer and at least one GaNAs layer comprising 1.5 to 8% molar As concentration.

In another embodiment, the invention is a type II quantum well (QW) active region, comprising a GaNAs layer sandwiched between two InGaN layers.

In still another embodiment, the invention is a method for making a gallium nitride-based device comprising: providing a semiconductor substrate; and forming on the substrate a succession of layers to provide a type-II active region over the substrate, comprising at least one InGaN layer and at least one GaNAs layer adjacent a GaN barrier layer.

In another embodiment, the invention is an optoelectronic device comprising: a multilayer semiconductor structure including a GaN layer and an active region, the active region comprising at least a hole quantum well layer of InGaN and electron quantum well layers adjacent to the hole quantum well layer at least one of which comprises GaNAs to provide a type II quantum well structure, wherein the electron quantum well layers and hole quantum well layer form a first quantum well stage, and wherein the active region comprises a plurality of quantum well stages adjacent to each other having the same structure as the first quantum well stage, and including a transitional layer of GaN between each quantum well stage.

In another embodiment, the invention is a semiconductor laser comprising: (a) a multilayer semiconductor structure comprising a GaN layer and an active region comprising at least a hole quantum well layer comprising GaNAs and at least one electron quantum well layer adjacent to the hole quantum well layer that comprises an InGaN layer comprising 1.5 to 8% As concentration to provide a type II quantum well structure; and (b) an optical feedback structure to provide lasing action in the active region.

In still another embodiment, the invention is a method for making an optoelectronic device, comprising: providing a GaN layer; forming an active region over the GaN layer, the active region comprising at least one InGaN layer and at least one GaNAs layer adjacent a GaN barrier layer; and forming portions electrically coupled to the active region and adapted for exciting the active region. In an embodiment, the invention is a method for manufacturing a semiconductor device, comprising: providing a GaN layer; forming an active region over the GaN layer, the active region comprising a type II InGaN—GaNAs quantum well adjacent a GaN barrier layer; growing a layer over the active region while annealing the active region; and providing portions of the optoelectronic semiconductor device electrically coupled to the active region and adapted for exciting the active region.

In still another embodiment, the invention is a method for making an optoelectronic device, comprising: providing a GaN layer; selecting an As content to provide a target emission wavelength for an optoelectronic device active region, forming the active region over a GaN layer, the active region comprising at least one InGaN layer and at least one GaNAs layer adjacent a GaN barrier layer, wherein the GaNAs layer comprises the selected As content; and forming portions electrically coupled to the active region and adapted for exciting the active region.

In another embodiment, the invention is a method for generating optical emission from an optoelectronic device, comprising providing a GaN layer; forming an active region over the GaN layer, the active region comprising a InGaN—GaNAs quantum well adjacent a GaN barrier layer; forming portions electrically coupled to the active region and adapted for exciting the active region; and exciting the active region to produce optical emission.

BRIEF DESCRIPTION OF THE DRAWING

FIGS. 1A and 1B are schematics of type I and type II quantum well structures;

FIGS. 2A and 2B are graphs showing electron-hole wavefunction overlap;

DETAILED DESCRIPTION OF THE INVENTION

Figure 3A:
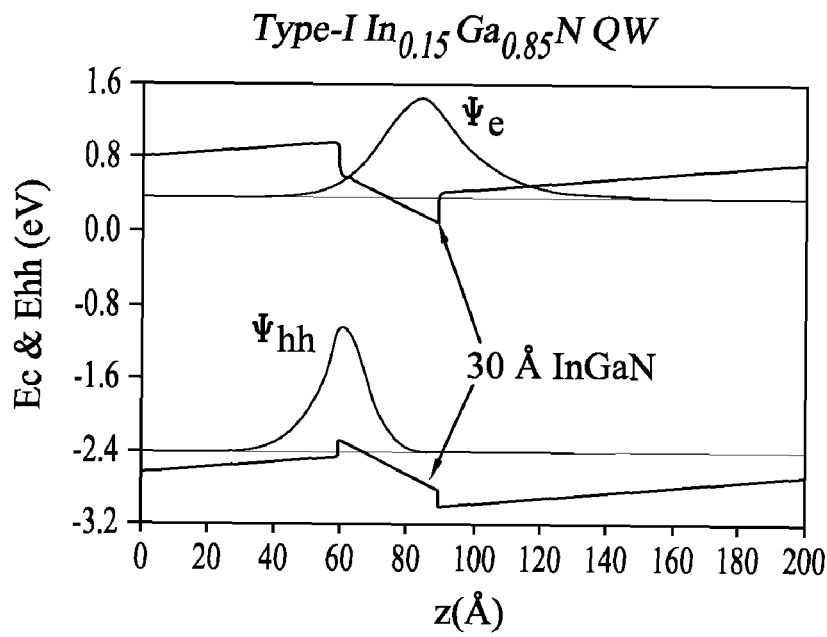
FIGS. 3A and 3B are graphs showing energy band lineup.

The term "quantum well" (QW) used herein refers to a thin-layer structure comprising alternate layers consisting of a first semiconductor layer with a thickness smaller than the de Broglie wavelength of about 200 Å to 300 Å with respect to electrons or holes and at least a second semiconductor layer with a band gap greater than that of the first semiconductor layer. A "substrate" is an underlying template or substratum can such as a sapphire template, an Si substrate, SiC substrate or ZnO substrate.

A quantum well structure can be formed by sandwiching a semiconductor thin layer of a narrow band gap between semiconductor layers of a broad band gap. If a single semiconductor thin layer constitutes a quantum well for both electrons and holes, the quantum well is called a type I quantum well. In this case, the semiconductor layer of a narrow band gap is called a well layer, and the semiconductor layers of a broad band gap are called barrier layers. A type I multi-quantum well structure can be formed by alternately laminating semiconductor layers of narrow and broad band gaps.

A type II quantum well structure has a first semiconductor layer forming a quantum well for electrons, a second semiconductor layer forming a quantum well for holes formed on the first semiconductor layer and third semiconductor layers sandwiching the first and second semiconductor layers as barrier layers to the electrons and holes. A type II multi-quantum well structure can be formed by alternately laminating first semiconductor layers, second semiconductor layers and third semiconductor layers.

The invention may be embodied in various types of optoelectronic devices including amplifiers, light emitting diodes and edge emitting and surface emitting lasers that incorporate optical feedback to provide lasing action. The invention may find application in solid state lighting, solid state displays, lasers, light emitting diodes (LEDs), biomedical therapy and diagnostic devices, medical lasers, eye surgery devices and DVD lasers.

The invention provides a type II InGaN—GaNAs quantum well for realizing a large optical gain active region for high brightness/efficient LEDs and low-threshold lasers in the visible regime, covering in one embodiment, an emission wavelength of 420-nm (blue) up to 650-nm (red).

In an embodiment, the invention relates to an optoelectronic device that includes a GaN layer and a type II quantum well active region. The active region can comprise at least an GaNAs hole quantum well layer and electron quantum well layers adjacent to the hole quantum well layer. At least one of the electron quantum well layers is InGaN. The electron quantum well layers and hole quantum well layer form a first quantum well stage. The active region can include a plurality of the quantum well stages adjacent to each other having the same structure as the first quantum well stage. The structure can include a transitional layer of GaN between each quantum well stage.

An inventive QW structure can be grown by III-V semiconductor MOCVD/MBE epitaxy and molecular beam epitaxy (MBE). However, for manufacturing considerations such as high-throughput, the use of metal organic chemical vapor deposition (MOCVD) growth may be preferred.

Incorporation of dilute N into a GaAs QW regime results in conduction band edge splitting and reduction of transitional energy gap. Conduction band edge splitting is defined as the creation of two energy level states (E+ and E− state) in the conduction band, due to the existence of a narrow resonant impurity energy state inside the conduction band. Transitional energy gap is the energy gap from a lower conduction energy level (where electrons reside) to the top of a valence band (where holes reside). The transition from E− state to the top of valence band state results in reduced transitional energy.

FIG. 1A of the drawings is a schematics of a type-I InGaN QW and FIG. 1B is a type-II InGaN—GaNAs QW structure formed by introducing a thin layer of N-rich GaNAs QW (As-content ~1.5-8%) sandwiched by InGaN QW layers.

Electron-hole wavefunction overlap plays a role in the radiative recombination rate of a QW. Large spontaneous emission rate and stimulated emission rate and optical gain are proportional quadratically to $\Gamma_{e-hh}$, where $\Gamma_{e-hh}$ is defined as overlap of the electron and hole wavefunctions in an active region. Electron-hole wavefunction overlap is related to the radiative recombination rate of the QW. A radiative recombination rate of a QW is proportional quadratically to $\Gamma_{e-hh}$. Large radiative recombination rates of QW can provide high efficiency LEDs and low threshold lasers. According to the invention, energy band lineup of the FIG. 2B structure can be engineered to take advantage of its polarization-induced electric field to improve electron-hole wavefunction overlap ($\Gamma_{e-hh}$) over that of the type-I nitride QW.

The invention can provide an InGaN—GaNAs type-II QW structure that has extended emission wavelength coverage and large electron-hole wavefunction overlap. For example, the addition of 2% As into a GaN layer reduces transitional energy gap to ~2.7 eV, which is 700 meV lower than that of a bulk GaN. Additionally, the low As-containing GaNAs regime may have improved device characteristics such as improved $J_{th}$ due to a higher $\Gamma_{e-hh}$ resulting in improved optical gain. A low As-containing GaNAs regime can extend emission wavelength of a type-II QW from blue to a yellow green. Features of the invention will become apparent from the drawings and following detailed discussion, which by way of example without limitation describe preferred embodiments of the invention.

EXAMPLES

The EXAMPLES are based on numerical models of QW gain media including models of an inventive type II InGaN—

GaNAs QW gain media that emit from ~450 nm (blue) up to ~550 nm (yellow green) with improved overlap ($\Gamma_{e-hh}$>65-70%).

As matters of definition, an energy band lineup calculation is a method to compute energy band edges of conduction bands and valence bands of different types of semiconductor materials. Energy band lineup is used to determine transition wavelength and electron-hole wavefunction overlap ($\Gamma_{e-hh}$). The term "wurtzite band edge energies" refers to energy band edges of semiconductor materials that are in a hexagonal crystal configuration. Band structure parameters are experimentally-measured material parameters used as inputs to calculate the energy band lineup, e.g., energy gap, effective mass and affect of strain. In the drawings, $\Psi$ is wavefunction. In FIGS. 2A, 2B, 3A, 3B, 4A and 4B, $\Psi_e$ is electron hole wavefunction and $\Psi_{hh}$ is the heavy hole wavefunction.

The numerical models of the EXAMPLE were constructed according to the following. In a first step, concentration profiles of In and dilute As-species were defined as functions of position along a growth axis. These concentration profiles were incorporated into an energy band lineup calculation for a proposed type-II QW structure, based on Kane's model for wurtzite band edge energies and Luttinger-Kohn's model for band structure parameters.

Effects of strain were evidenced by band edge energy shifts and polarization-induced electric field as manifested in energy band bending. Quantum-confined electron and hole energy levels were computed using effective mass approximation according to a propagation matrix for multilayer heterostructures.

The following EXAMPLES are based on mathematical models developed according to the following. A structure was postulated having GaN layers and a type II quantum well comprising an InGaN layer and a GaNAs layer. Valence band edge of the GaN layers was equated to a reference energy $E_v^0$. The GaN heavy hole band edge $E_1^0$ was calculated as follows:

$$E_{1\_GaN}^0 = E_{v\_GaN}^0 + \Delta_1 + \Delta_2 \qquad (1),$$

where $\Delta_1 = \Delta_{cr}$ is crystal field split-off energy and $3\Delta_2 = \Delta_{so}$. $\Delta_{so}$ is spin-orbit split-off energy. Conduction band edge of unstrained GaN layers $E_c^0$ was obtained by adding the energy gap to valence band edge energy levels:

$$E_{c\_GaN}^0 = E_{v\_GaN}^0 + \Delta_1 + \Delta_2 + E_{g\_GaN} \qquad (2).$$

For the case of strained InGaN QW, the energy gap was given as (in eV):

$$E_{g\_InGaN}(x) = (1-x) \cdot E_{g\_GaN} + x \cdot E_{g\_InN} - b \cdot x \cdot (1-x) \qquad (3)$$

where x is In content and b is the bowing parameter of wurtzite InGaN.

A strain tensor in the InGaN QW layer was calculated as follows:

$$\varepsilon_{xx} = \varepsilon_{yy} = \frac{a_o - a}{a_o} \qquad (4)$$

where $\alpha_o$ is the lattice constant of GaN and a is the interpolated lattice constant of strained InGaN QW layers. Perpendicular strain tensors were expressed as:

$$\varepsilon_{zz} = -2 \cdot \frac{C_{13}}{C_{33}} \cdot \varepsilon_{xx} \qquad (5)$$

where $C_{13}$ and $C_{33}$ are the interpolated elastic stiffness constants. Conduction and valence band offset ($\Delta E_c$ and $\Delta E_v$) between GaN and InGaN QW followed from the 70:30 ratio, hence the heavy hole band edge of InGaN QW was given as:

$$E_{hh\_InGaN}^0 = E_{v\_GaN}^0 + \Delta E_v + \Delta_{1\_InGaN} + \Delta_{2\_InGaN} \qquad (6).$$

Due to the presence of strain, the heavy hole band edge was shifted according to:

$$E_{hh\_InGaN\_strained} = E_{hh\_InGaN}^0 + \theta_\in + \lambda_\in \qquad (7)$$

where $\theta_\in$ and $\lambda_\in$ are strain-induced energy shifts and were expressed as follow:

$$\theta_\in = D_3 \cdot \varepsilon_{zz} + D_4 \cdot (\varepsilon_{xx} + \varepsilon_{yy}) \qquad (8)$$

$$\lambda_\in = D_1 \cdot \varepsilon_{zz} + D_2 \cdot (\varepsilon_{xx} + \varepsilon_{yy}) \qquad (9)$$

where $D_1$, $D_2$, $D_3$, and $D_4$ are the deformation potentials of nitride semiconductors.

There is a hydrostatic energy shift $P_{c\in}$ associated with conduction band of the InGaN QW:

$$P_{c\in} = a_{cz} \cdot \varepsilon_{zz} + a_{ct} \cdot (\varepsilon_{xx} + \varepsilon_{yy}) \qquad (10)$$

where $a_{cz}$ and $a_{ct}$ are the conduction band deformation potentials and are assumed to be equal. The strained InGaN QW conduction band edge $E_c$ was calculated by:

$$E_{c\_InGaN\_strained} = E_{c\_GaN}^0 - \Delta E_c + P_{c\in} \qquad (11).$$

Flat conduction band alignment between GaN and GaAs with 2 eV valence band offset was assumed in developing valence band hybridization information for the N-rich GaNAs model. Heavy hole band edge of the GaNAs model was expressed as:

$$E_{hh\_GaNAs} = E_{c\_GaN}^0 - E_{g\_GaNAs} \qquad (12).$$

The energy gap of GaNAs was attributed to transition between the GaN conduction band edge and was calculated by virtual crystal approximation (VCA) assuming a new valence band edge formed by hybridization of As-like states and the GaN valence band. The transitional gap of the N-rich GaNAs model was linearly extrapolated as (in eV) from experimental data for low As-content y up to 8%:

$$E_{g\_GaNAs}(y) = -4.565 \cdot y + 2.7978 \qquad (13).$$

Polarization effect was calculated as follows: Spontaneous and piezoelectric polarization-induced electric field information was incorporated into the energy band lineup for a multilayered heterostructure, electric field $E_j$ in layer j according to:

$$E_j = \frac{\sum_k \frac{l_k \cdot P_{tot\_k}}{\varepsilon_k} - \sum_k \frac{P_{tot\_j} \cdot l_k}{\varepsilon_k}}{\varepsilon_j \sum_k \frac{l_k}{\varepsilon_k}} \qquad (14)$$

Summations on all layers including the $j_{th}$ layer. $P_{\_tot\_k}$, $l_k$, and $\varepsilon_k$ were total polarization, thickness and dielectric permittivity of layer k. Total polarization $P_{\_tot}$ was:

$$P_{\_tot} = P_{\_piezo} + P_{\_sp} \qquad (15)$$

where $P\_{piezo}$ and $P\_{sp}$ were the piezoelectric and spontaneous polarization, respectively. The summations were calculated as functions of In content for InGaN QW models:

$$P\_{piezo}(x) = 0.148 \cdot x - 0.0424 \cdot x \cdot (1-x) \quad (16)$$

and $$P\_{sp}(x) = -0.042 \cdot x - 0.034 \cdot (1-x) + 0.037 \cdot x \cdot (1-x) \quad (17).$$

Dielectric constants of the InGaN models were calculated according to (18):

$$\in\_{InGaN}(x) = 4.33 \cdot x + 10.28 \quad (18).$$

Example 1

In this EXAMPLE, Stark effect is the affect of an electric field on electronic band structure in semiconductors. For quantum-based devices, the Stark effect is referred to as quantum confined Stark effect. In nitride-based semiconductors, polarization induced electric field leads to bending of both conduction band and the valence bands. A Band-bending effect can be observed for a QW as quantum-confined Stark effect and spatial separation of peak electron and hole wavefunction.

FIGS. 2A and 2B show a comparison of electron-hole wavefunction overlap ($\Gamma_{e-hh}$) in a type-I $In_{0.2}Ga_{0.8}N$ QW without (FIG. 2A) and with (FIG. 2B) polarization effect. Polarization increases with In-content. Hence the higher an In-content, the worse the bending and the more the reduction in overlap. As a result, electron-hole wavefunction overlap $\Gamma_{e-hh}$ is severely reduced with increasing QW thickness and higher In-content in a InGaN QW.

Electron-hole wavefunction overlap ($\Gamma_{e-hh}$) is related to the radiative recombination rate of the QW. Large radiative recombination rates of QW can lead to high efficiency LEDs and low threshold lasers. In the FIG. 2B type-I QW, energy band bending separates the electron and hole wavefunctions from one another, thus leading to a much reduced overlap, $\Gamma_{e-hh}$. Significant reduction in $\Gamma_{e-hh}$ was observed with the FIG. 2B polarization affect.

In FIG. 2A (without polarization affect), a flat band condition (no presence of electric field that bends the energy band edges) was assumed. Both electrons and holes were confined in the center of the InGaN QW, as indicated by the coincidental peaks of electron and hole wavefunctions $\Psi_e$ and $\Psi_{hh}$. (FIGS. 2A and 2B also show conduction bend for each of $\Psi_e$ and $\Psi_{hh}$ with an energy level base line.) A large electron-hole wavefunction ($\Gamma_{e-hh} \sim 97.5\%$) resulted from the flat band lineup condition shown in the figures, with peak emission of ~417-nm. A flatband lineup condition is an energy band lineup condition when the energy bands are not influenced by polarization induced electric field.

In a polar semiconductor such as a nitride semiconductor, an electric field bends a conduction and valence band and consequently peaks of electron and hole wavefunctions are spatially separated from one another. The spatial separation of electron and hole wavefunctions represents a charge separation that can reduce overlap to only 34.5% with emission wavelength significantly redshifted, resulting in peak emission of ~463-nm. The reduced electron-hole wavefunction overlap ($\Gamma_{e-hh}$) in type-I InGaN QW due to the polarization effect leads to severe reduction in its optical gain ($\sim |\Gamma_{e-hh}|^2$), thus resulting in high-threshold carrier and current density operation for the conventional nitride-based laser devices.

Example 2

Figure 3B:
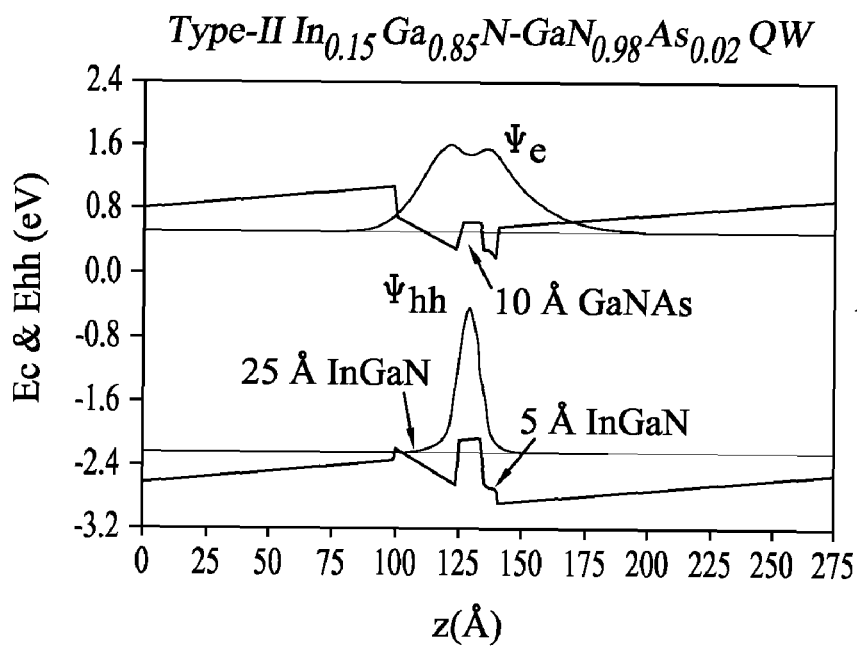

FIG. 3B shows energy band lineup of a type-II InGaN—GaNAs QW with 15% In and 2% As. A lineup of the type-I InGaN QW structure with 15% In is shown for comparison purposes in FIG. 3A.

FIG. 3A shows a spatial separation of electron and hole wavefunctions that results in a low $\Gamma_{e-hh}$ of 34.5% for the type-I InGaN QW structure. FIG. 3B shows the type-II QW electron wavefunction peak substantially coincidental with that of its hole wavefunction peak. This represents a significant improvement in electron-hole wavefunction overlap as contrasted to the type-I QW. FIG. 3B illustrates that combinations of In- and As-content of the type-II InGaN—GaNAs QW can be engineered to affect energy band lineup to take advantage of the polarization-induced electric field inherent in nitride semiconductors.

Example 3

Figure 4A:
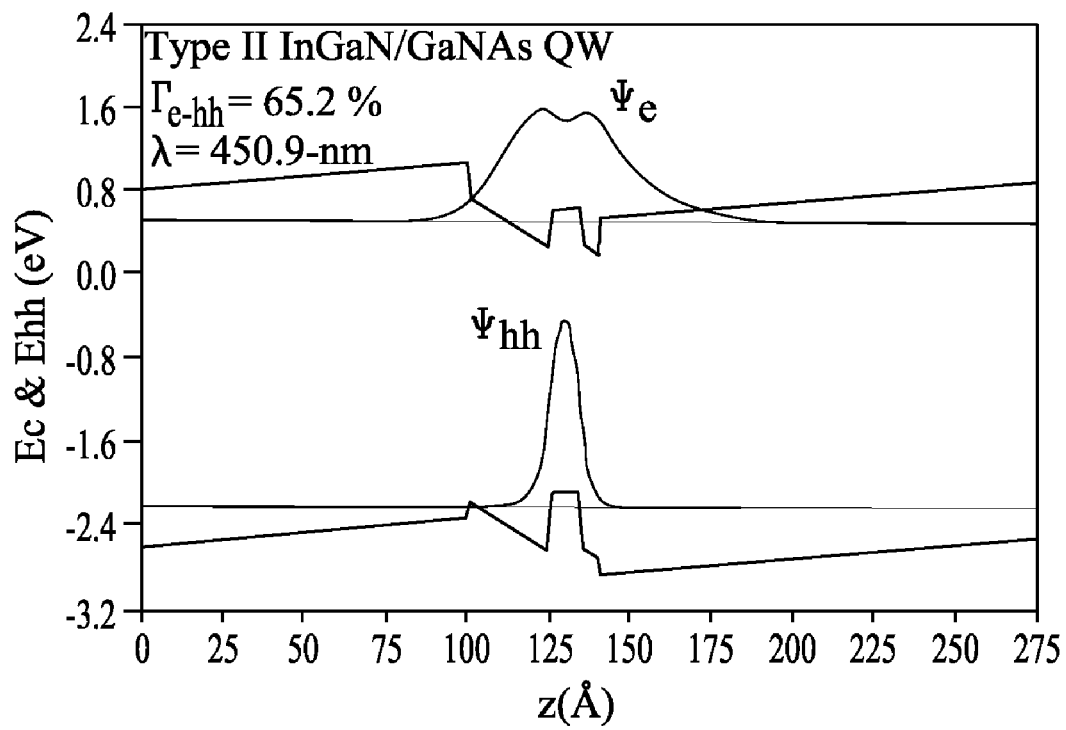
FIG. 4A is a graph of electron-hole wavefunction overlap of the schematic FIG. 4B quantum well structure.
Figure 4B:
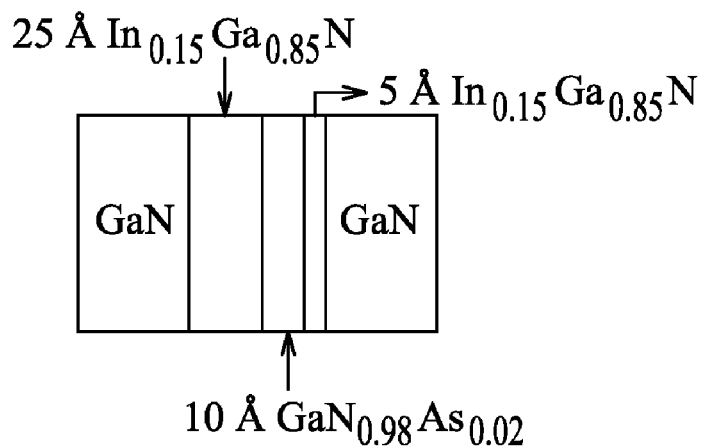

FIG. 4A illustrates electron-hole wavefunction overlap ($\Gamma_{e-hh}$) for the FIG. 4B InGaN/GaNAs type-II QW. The FIG. 4B structure comprises a GaN layer and a type-II quantum well active region over the GaN layer, the active region comprising a 10 Å $GaN_{0.98}As_{0.2}$ layer sandwiched between a 25 Å $In_{0.15}Ga_{0.85}N$ layer and a 5 Å $In_{0.15}Ga_{0.85}N$ layer with a GaN barrier layer. FIG. 4A shows a high $\Gamma_{e-hh}$ of 65.2% is obtained for emission wavelength ($\lambda$) in the blue regime (450-nm), approximately two times that obtained in a type-I InGaN QW.

This EXAMPLE illustrates that layer thicknesses and compositions of the invention type-II QW structure can be adjusted to provide different wavelength emissions. In this EXAMPLE, the FIG. 4B structure is adjusted to give a peak emission wavelength in the blue regime ($\lambda \sim 450$-nm), while maintaining high $\Gamma_{e-hh}$ of 65.2%. A type-I InGaN QW emitting in the same regime has a low $\Gamma_{e-hh}$ of <30% as illustrated in FIG. 3A.

For a fixed thickness, $\lambda$ for a type-I InGaN QW may be lengthened by increasing In content. However, increased In content can increase the QW defect density and phase separation. For example, typical type-I InGaN QW requires an In content close to 20% for $\lambda \sim 450$ nm. On the other hand, one of the inventive InGaN/GaNAs QWs requires only 15% In and 2% As for emission in the same regime. Less In content is required in the inventive InGaN/GaNAs QW to achieve the same emission. The lower In-content InGaN QW results in lower strain with respect to the GaN substrate, thus allowing the threading dislocation density to be reduced in the materials. Lower In-content also results in less phase separation in the materials, where "phase separation" is compositional fluctuation in the materials.

Example 4

Figure 5A:
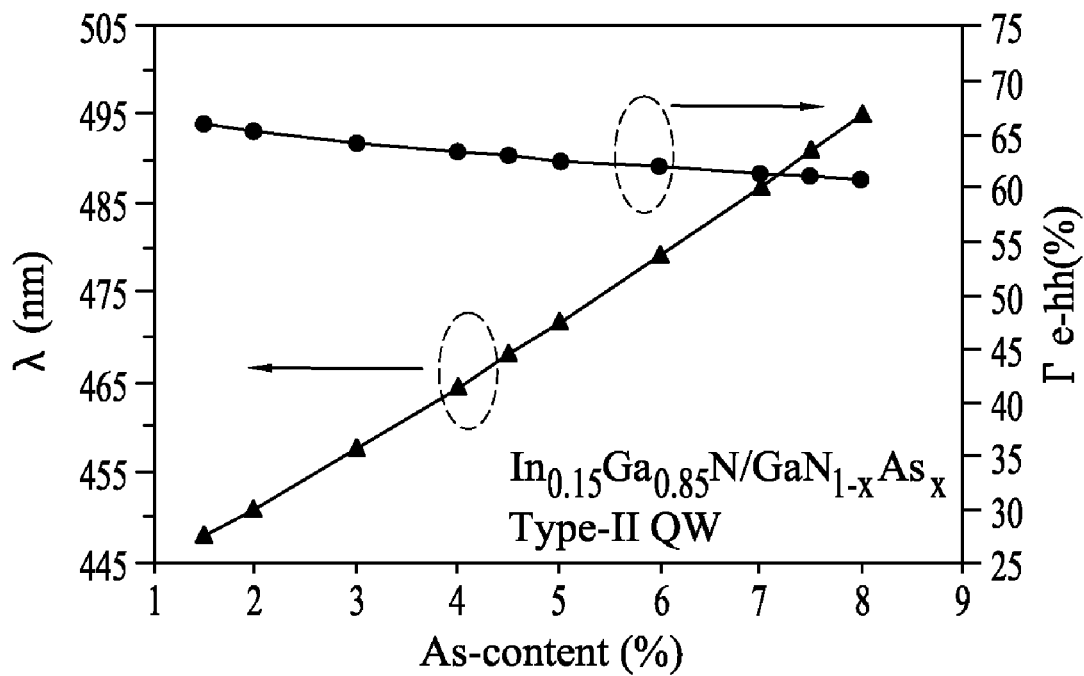
FIG. 5A is a graph showing As-content effect on wavelength λ and electron-hole wavefunction overlap of the schematic FIG. 5B quantum well structure.
Figure 5B:
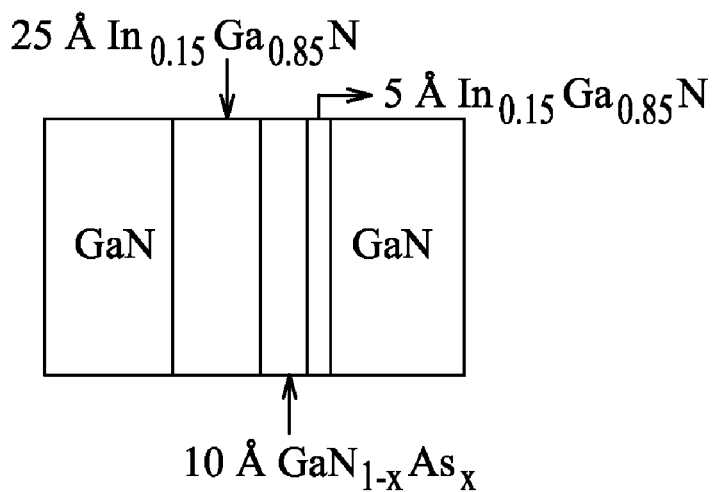

FIG. 5A shows effect of As-content on wavelength $\lambda$ and electron-hole wavefunction overlap $\Gamma_{e-hh}$ for the FIG. 5B structure. The FIG. 5B structure comprises a GaN layer and a type-II quantum well active region over the GaN layer. The type-II active region comprises a 10 Å $GaN_{1-x}As_x$ layer sandwiched between a 25 Å $In_{0.15}Ga_{0.85}N$ layer and a 5 Å $In_{0.15}Ga_{0.85}N$ layer with a GaN barrier layer.

FIG. 5A illustrates that as type-II QW As-content is increased from 1.5% to 8%, emission wavelength (redshift) is significantly extended by approximately 45 nm, accompanied by less than 5% $\Gamma_{e\text{-}hh}$ decrease. Also, FIG. 5A illustrates that a high $\Gamma_{e\text{-}hh}$ of 60%-70% can be maintained over this As-content range. The FIG. 5A results illustrate efficacy of dilute As content (from about 1.5% to 8%) as a range to permit significant emission wavelength extension (by 45-nm) while maintaining high electron-hole wavefunction overlap ($\Gamma_{e\text{-}hh}$~60%-70%).

Example 5

Figure 6A:
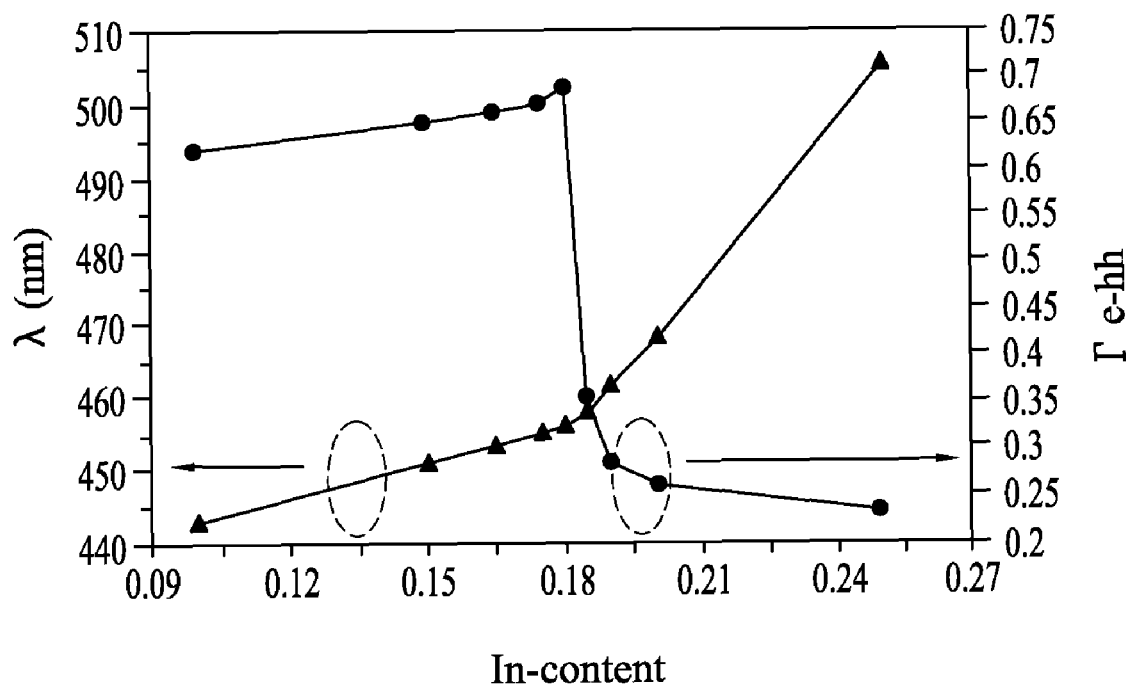
FIG. 6A is a graph of In-content effect on wavelength λ and electron-hole wavefunction overlap of the schematic FIG. 6B quantum well structure.
Figure 6B:
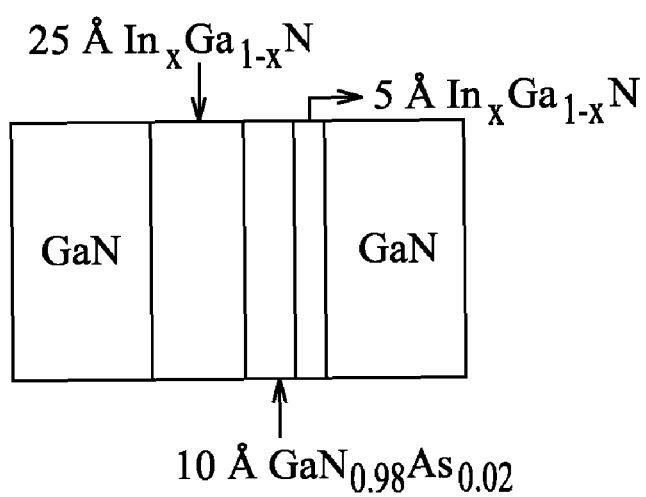

FIG. 6A shows In content effect on wavelength λ and electron-hole wavefunction overlap $\Gamma_{e\text{-}hh}$. A sharp drop in $\Gamma_{e\text{-}hh}$ at around In-content >18% can be attributed to shift in hole confinement. FIG. 6A shows that increasing the In-content in the bottom InGaN QW layer leads to a different trend. Both electron-hole wavefunction overlap and peak emission wavelength increase with increasing In-content (tri-angled line). Overlap $\Gamma_{e\text{-}hh}$ is substantially constant (dotted line) in the high 65%-70% range. However, a sharp drop in $\Gamma_{e\text{-}hh}$ occurs as In-content is increased in the low range (~18%), while the peak emission wavelength continues to increase.

The EXAMPLES 2 through 5 show that type-II InGaN—GaNAs QW can be engineered to take advantage of the energy band bending caused by inherent polarization-induced electric field to provide a QW structure that emits at 420-550 nm or beyond, while maintaining a large electron-hole wavefunction overlap. A high electron-hole wavefunction overlap of more than three times that of type-I InGaN QW can be achieved from the invention type-II QW structure. The type-II QW structure provides long visible emission wavelength with improved optical gain. Polarization engineering of the type-II QW band lineup can suppress active region charge separation.

Example 6

In an embodiment, the invention relates to a high-performing, high-efficiency gallium nitride-based light emitting diode (LED) and laser diode that emit in the visible regime from about 420-nm up to about 650-nm. Another embodiment provides a high efficiency blue-green-red gain media that can be integrated into a single semiconductor chip to achieve a high performance solid state lighting that may replace general illumination light sources such as fluorescent and incandescent lamps. The invention can provide a lower-cost, high-performance diode laser in the green regime that may replace bulky and expensive frequency-doubled Nd:YAG-based lasers and Argon-ion lasers for medical therapy and diagnostic applications.

Figure 7:
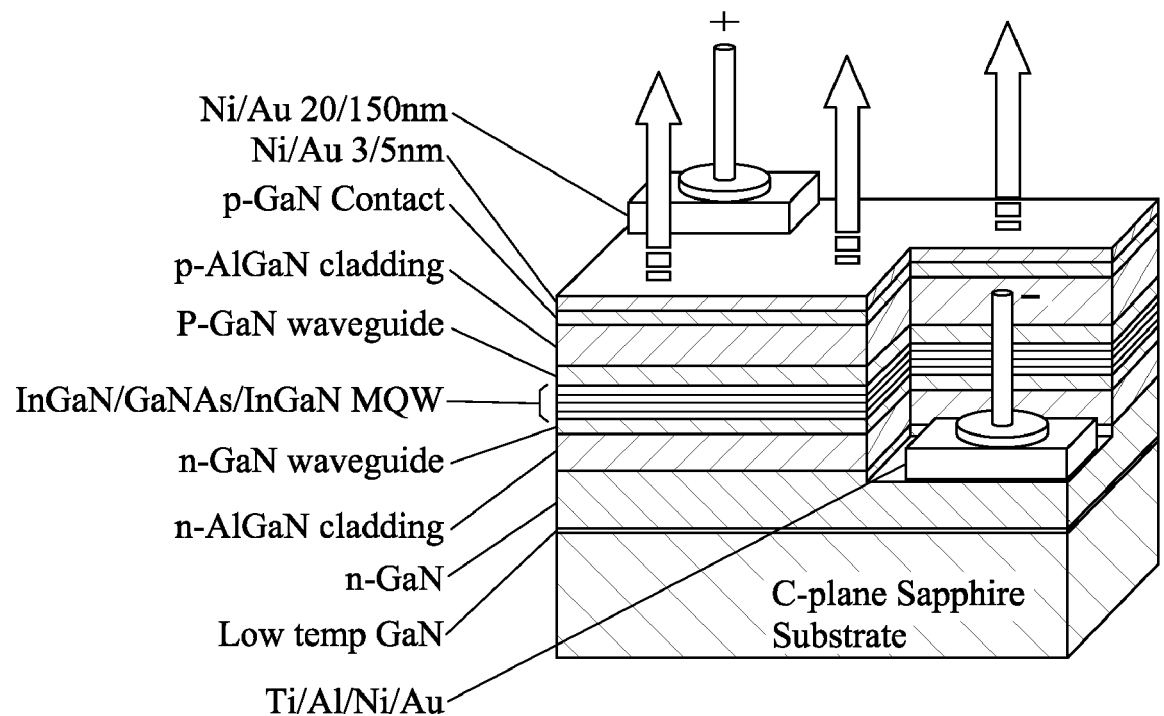
FIG. 7 is a sectional view of an active region of a laser diode structure.

FIG. 7 is a sectional view of an active region of a laser diode structure according to an example application of the present invention. The figure illustrates an LED structure having a Type-II InGaN—GaN multiple quantum well active region. The nine quantum well active region 14, as illustrated in FIG. 7, is shown to include QW layers 210, 220, 230, 240, 250, 260, 270, 280, 290, respectively, between GaNAs-based barrier layers 205, 215, 225, 235, 245, 255, 265, 275, 285, 295. In one example application, this illustrated structure is formed with each of the respective thicknesses of the QW layers 10, 20, 30, 40, 50, 60, 70, 80, 90 being 65 Angstroms, and each of the respective thicknesses of the GaNAs-based barrier layers 205, 215, 225, 235, 245, 255, 265, 275, 285, 295 being 200 Angstroms. An example set of compositions of each of the QW layers and the GaNAs-based barrier layers is $Ga_{0.07}In_{0.3}N_{0.983}As_{0.017}$ and $GaN_{0.98}As_{0.02}$ respectively. In the FIG. 7 example, the first layer above the substrate can be a low temperature GaN, followed by n-doped GaN, n-doped AlGaN cladding, n-doped GaN waveguide, InGaN—GaNAs Type II QW, p-doped GaN waveguide, p-doped AlGaN cladding and a p-doped GaN contact layer.

Thickness of the quantum well of the invention, depends on desired spacing between energy levels and the difference in the InGaN layer thickness can be part of the electron and hole wavefunction engineering for achieving large overlap. In examples for energy levels of greater than a few tens of millielectron volts (meV, to be compared with room temperature thermal energy of 25 meV), the critical dimension is approximately a few hundred angstroms. In embodiments, the QW GaNAs layer can have a thickness of about 3 Å to about 30 Å, desirably 5 Å to 15 Å and preferably of 8 Å to 12 Å. The GaNAs layer comprises a low As-content of only about 0.5 to 15 molar percent, desirably between 1.5 to 10 molar percent and preferably 2 to 8 molar percent. And in an embodiment, the GaNAs layer is sandwiched between about 10 Å to about 40 Å InGaN layer and about 3 Å to about 20 Å InGaN layer.

The GaNAs layer is surrounded by InGaN quantum well layers of different thicknesses. In an invention embodiment, different InGaN layer thicknesses are provided as part of electron and hole wavefunction engineering to achieve large overlap. As illustrated in the above figures, the polarization field in the nitride semiconductor leads to asymmetric band bending. Different InGaN layer thicknesses can be engineered to compensate for the bending. In embodiments of the invention, one InGaN layer is about 10 Å to about 40 Å, desirably 20 Å to 30 Å and preferably 23 Å to 28 Å in thickness. A second narrower layer is about 0.5 Å to 20 Å, desirably 1 Å to 9 Å and preferably 3 Å to 7 Å in thickness.

An inventive Type-II quantum well semiconductor laser can be a component in a host of products, including compact disk players and laser printers, and play important roles in optical communication schemes. Laser operation depends on the creation of nonequilibrium populations of electrons and holes, and coupling of electrons and holes to an optical field, which will stimulate radiative emission. Quantum wells provide an active layer in such lasers: the carrier confinement and nature of the electronic density of states results in efficient devices operating at lower threshold currents than lasers with "bulk" active layers. In addition, the use of a quantum well, with discrete transition energy levels dependent on the quantum well dimensions (thickness), provides a means of "tuning" the resulting wavelength of the material.

While preferred embodiments of the invention have been described, the present invention is capable of variation and modification and therefore should not be limited to the precise details of the Examples. The invention includes changes and alterations that fall within the purview of the following claims.

What is claimed is:

1. A method for making a gallium nitride-based device comprising: providing a semiconductor substrate; and forming on the semiconductor substrate a succession of layers to provide a type II active region over the semiconductor substrate, comprising at least one InGaN layer and at least one GaNAs layer adjacent a GaN barrier layer.

2. The method of claim 1, comprising forming on the semiconductor substrate a succession of layers to form an inner contact layer, a multiple quantum well stack comprising the type II active region, and an outer contact layer.

3. The method of claim 1, wherein forming the type II active region comprises forming at least one 10 Å to 40 Å thick InGaN layer and at least one 3 Å to 30 Å thick GaNAs layer.

4. The method of claim 1, wherein forming the type II active region comprises forming multiple pairs of InGaN and GaNAs quantum well layers, each of the multiple pairs of InGaN and GaNAs quantum well layers located between a pair of GaN barrier layers.

5. A method for making an optoelectronic device, comprising: providing a GaN layer; forming a type II quantum well active region over the GaN layer, the type II quantum well active region comprising at least one InGaN layer and at least one GaNAs layer adjacent a GaN barrier layer; and forming portions electrically coupled to the type II quantum well active region and adapted for exciting the type II quantum well active region.

6. The method of claim 5, wherein forming the type II quantum well active region comprises forming multiple pairs of InGaN and GaNAs quantum well layers, each of the multiple pairs of InGaN and GaNAs quantum well layers located between a pair of GaN barrier layers.

7. A method for manufacturing a semiconductor device, comprising: providing a GaN layer; forming an active region over the GaN layer, the active region comprising a type II InGaN—GaNAs quantum well adjacent a GaN barrier layer; growing a layer over the active region while annealing the active region; and providing portions of the semiconductor device electrically coupled to the active region and adapted for exciting the active region.

8. The method of claim 7, wherein forming the active region comprises forming multiple InGaN—GaNAs pairs of quantum well layers, each of the multiple InGaN—GaNAs pairs of quantum well layers located between a pair of GaN barrier layers.

9. The method of claim 7, wherein forming the active region comprises forming at least one 10 Å to 40 Å thick InGaN layer and at least one 3 Å to 30 Å thick GaNAs layer.

10. A method for making an optoelectronic device, comprising: providing a GaN layer; selecting an As content to provide a target emission wavelength for an optoelectronic device type II quantum well active region, forming the optoelectronic device type II quantum well active region over the GaN layer, the type II quantum well active region comprising at least one InGaN layer and at least one GaNAs layer adjacent a GaN barrier layer, wherein the GaNAs layer comprises the selected As content; and forming portions electrically coupled to the optoelectronic device type II quantum well active region and adapted for exciting the optoelectronic device type II quantum well active region.

11. A method for generating optical emission from an optoelectronic device, comprising providing a GaN layer; forming a type II quantum well active region over the GaN layer, the active region comprising an InGaN—GaNAs type II quantum well adjacent a GaN barrier layer; forming portions electrically coupled to the type II quantum well active region and adapted for exciting the type II quantum well active region; and exciting the type II quantum well active region to produce the optical emission.

* * * * *